United States Patent [19]

Premerlani

[11] Patent Number: 4,715,000

[45] Date of Patent: Dec. 22, 1987

[54] DIGITAL PHASE-LOCKED LOOP AND FREQUENCY MEASURING DEVICE

[75] Inventor: William J. Premerlani, Scotia, N.Y.

[73] Assignee: General Electric Company, Schenectady, N.Y.

[21] Appl. No.: 762,992

[22] Filed: Aug. 6, 1985

[51] Int. Cl.[4] .......................... H03L 7/08; G06F 15/31
[52] U.S. Cl. ...................................... 364/484; 364/726; 364/576; 364/715; 364/486; 328/133; 328/56; 328/155; 331/1 A; 331/25; 375/120; 375/81
[58] Field of Search ............... 364/484, 485, 715, 724, 364/736, 576, 726; 324/78 R, 78 D, 78 F, 29 R, 29 D; 328/133, 134, 56, 155; 331/25, 1 A; 375/81, 120

[56] References Cited

U.S. PATENT DOCUMENTS

| | | | |
|---|---|---|---|
| 3,878,473 | 4/1975 | Furtney, Jr. | 331/1 A |
| 4,319,329 | 3/1982 | Girgio et al. | 364/576 |
| 4,404,680 | 9/1983 | Perkins | 375/111 |
| 4,418,318 | 11/1983 | Swagerty et al. | 364/715 |
| 4,485,358 | 11/1984 | Andren et al. | 455/102 |
| 4,509,017 | 4/1985 | Andren et al. | 455/214 |
| 4,547,726 | 10/1985 | Premerlani | 324/78 Z |
| 4,568,912 | 2/1986 | Kitamura et al. | 364/576 |
| 4,596,964 | 6/1986 | Quaranta | 331/25 |
| 4,617,679 | 10/1986 | Brooks | 331/1 A |
| 4,619,002 | 10/1986 | Thro | 375/76 |
| 4,626,827 | 12/1986 | Kitamura et al. | 364/576 |
| 4,627,079 | 12/1986 | Von der Embse | 364/485 |
| 4,675,614 | 6/1987 | Gehrke | 328/133 |
| 4,677,648 | 6/1987 | Zurfluh | 375/120 |

OTHER PUBLICATIONS

"Digital Phase-Locked Loop" by R. Van Blerkom et al., IBM Technical Disclosure Bulletin, vol. 10, No. 3, Aug. 1967, pp. 256-257.

IEEE Transactions on Acoustics, Speech and Signal Processing, "Rapid Measurement of Digital Instantaneous Frequency", pp. 207-222.

Patent Application—GE Docket RD-15484—"Digital Frequency Locked Loop for Use with Staggered Sampling Systems"—W. J. Premerlani—filed 8-1-85, S.N. 761,267.

B.S.T.J. Brief—"Least-Squares Estimator for Frequency-Shift Position Modulation in White Noise" by V. E. Benes—Sep. 1980—pp. 1289-1296.

The Bell System Tech. Journal—"Spectral Moment Estimators: A New Approach to Tone Detection" by J. N. Denenberg, Feb. 1976—pp. 143-155.

IEEE Transactions on Communications, vol. COM-24, No. 10, "Algorithmic Measurement of Digital Instantaneous Frequency", pp. 1115-1121.

Primary Examiner—Felix D. Gruber
Assistant Examiner—V. N. Trans
Attorney, Agent, or Firm—Richard V. Burgujian; James C. Davis, Jr.; Paul R. Webb, II

[57] ABSTRACT

Method and apparatus are disclosed for providing a sampling signal having a frequency which is maintained in constant proportion to the frequency of an input signal. The input signal is sampled at instants determined by the sampling signal to provide a plurality of data signals associated with one cycle of the input signal. A signal processor is adapted to receive first and second pluralities of data signals associated with first and second cycles of the input signal and to perform two discrete Fourier analyses to provide two phasor signals representing two voltage phasors of respective fundamental frequencies of the discrete Fourier transforms. The phasor signals are used to generate a difference signal indicative of the angle between the two voltage phasors and, therefore, proportional to the difference between the sampling frequency and the input frequency. The difference signal is used to modulate the period of the sampling signal such that the frequency of the sampling signal is maintained in constant proportion to that of the input signal.

13 Claims, 4 Drawing Figures

DIGITAL PHASE-LOCKED LOOP AND FREQUENCY MEASURING DEVICE

BACKGROUND OF THE INVENTION

The present invention is directed in general toward phase-locked loops and, more particularly, toward a digital phase locked loop implemented with programmable digital signal processing methods.

There are many devices and methods presently available for determining frequency and for locking to an analog signal. Generally, they fall into two broad classes, to wit, analog and digital. Although analog phase-locked loops once dominated the art, continued progress in semiconductor technology, enhancing the performance, speed, and reliability of integrated circuits while simultaneously reducing their size and cost, has resulted in strong interest in the implementation of the phase-locked loop in the digital domain.

Aside from the obvious size and cost advantages associated with digital systems, a digital version of the phase locked loop alleviates many other problems associated with its analog counterpart, namely: sensitivity to dc drifts and component saturations, difficulties encountered in building higher order loops, and the need for initial calibration and periodic adjustments. In addition, since many systems requiring phase locking already employ digital signal processing devices to perform other functions, a digital phase locked loop can be readily implemented to make use of these processing devices thereby eliminating the need for other specialized circuitry and further reducing circuit cost.

Despite the increasing demand for digital phase locked loops, present day digital implementations of phase locking devices have proven inadequate for many applications. This is because conventional digital devices for locking a local signal to an analog input signal determine the frequency of the input signal by measuring the time interval between its zero crossings. However, this method of measuring the input frequency is sensitive to noise which may cause the timing of the zero crossing to fluctuate and, therefore, these systems have proven inaccurate. Further, this method is costly to implement because a digital counter must be employed and dedicated to measure the time interval between zero crossings. Alternatively, a processor may be used to measure this time interval, however, the processor performing the measurement must either be dedicated to the measurement or must be interrupted in the performance of other tasks to measure the zero crossing time.

There exists, therefore, a need to determine the frequency of an analog signal with a high degree of accuracy and to use this information to improve both the performance and productivity of signal processing elements used in digital phase locked loops.

SUMMARY OF THE INVENTION

The present invention addresses the aforementioned inadequacies of the prior art by providing a digital phase locked loop for providing a sampling signal at a frequency which is maintained in constant proportion to the frequency of an input signal wherein the frequency of the input signal is determined with a high degree of accuracy and without resorting to measuring time intervals occurring between zero crossings.

An analog to digital converter is provided for receiving the analog input signal and for providing a plurality of data signals at instants determined by the phase locked loop sampling signal. The data signals are each representative of the magnitude of the input voltage at the sampling instant.

A signal processor is provided for receiving data signals representing two cycles of the input signal and for performing a discrete Fourier analysis on these values to provide two phasor signals which are indicative of two voltage phasors, each voltage phasor being associated with one cycle of the input signal. A difference signal is generated from the two voltage phasors, which difference signal is proportional to the difference between the frequency of the analog input signal and the frequency of the sampling signal.

A fixed frequency driven counter, or other timing device, is provided for generating the sampling signal. The timing device is responsive to the difference signal from the signal processor for varying the frequency of the sampling signal such that its frequency is maintained to be in constant proportion to the frequency of the input signal.

It is, therefore, an object of the present invention to provide an improved digital phase locked loop.

It is a further object of the present invention to provide a digital phase locked loop wherein the input signal frequency is determined with a high degree of accuracy and without resorting to measuring time intervals between the zero crossing.

It is a still further object of the present invention to provide a method for locking a sampling signal to an input signal, which method can be implemented with programmable signal processing devices already found in most signal processing systems thereby eliminating the need for specialized phase locking circuitry.

BRIEF DESCRIPTION OF THE DRAWINGS

The subject matter which is regarded as invention is particularly pointed out in the claims appended hereto. The invention, however, both as to organization and method of practice, may best be understood from a reading of the following detailed description taken in conjunction with the drawings in which:

DETAILED DESCRIPTION OF THE DRAWINGS

Figure 3:
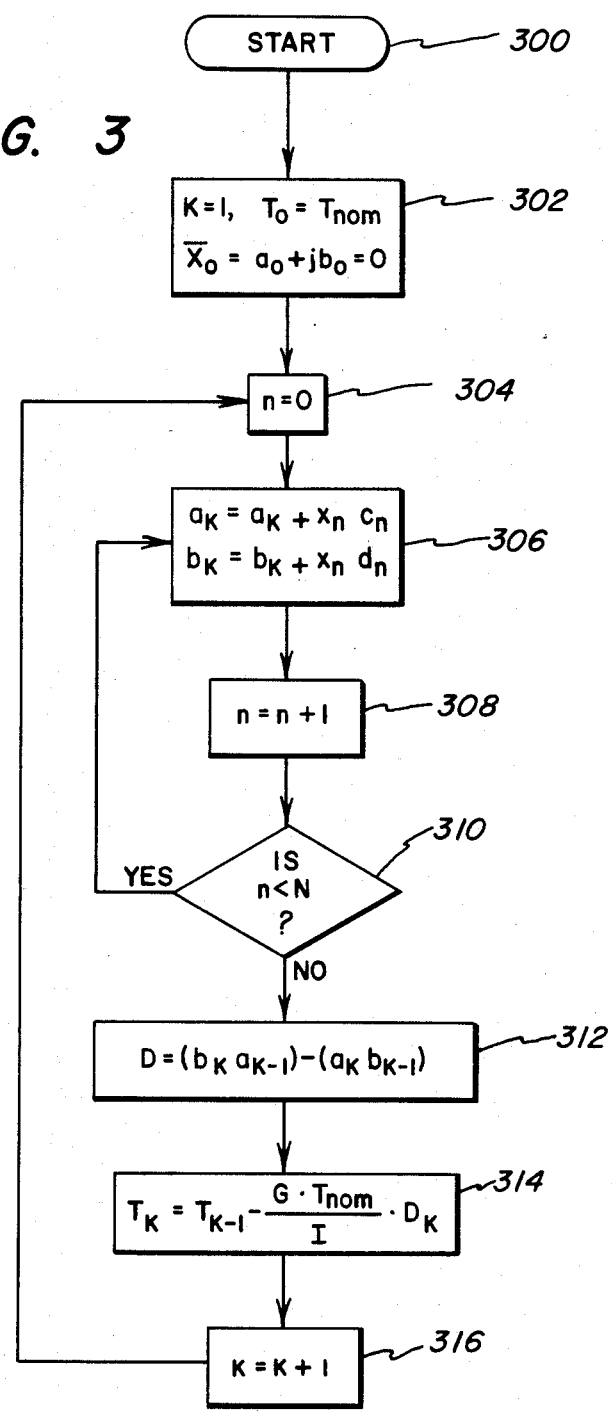
FIG. 3 is a decisional flow diagram illustrating the method for determining the frequency of the input signal in accordance with the subject invention.
Figure 4:
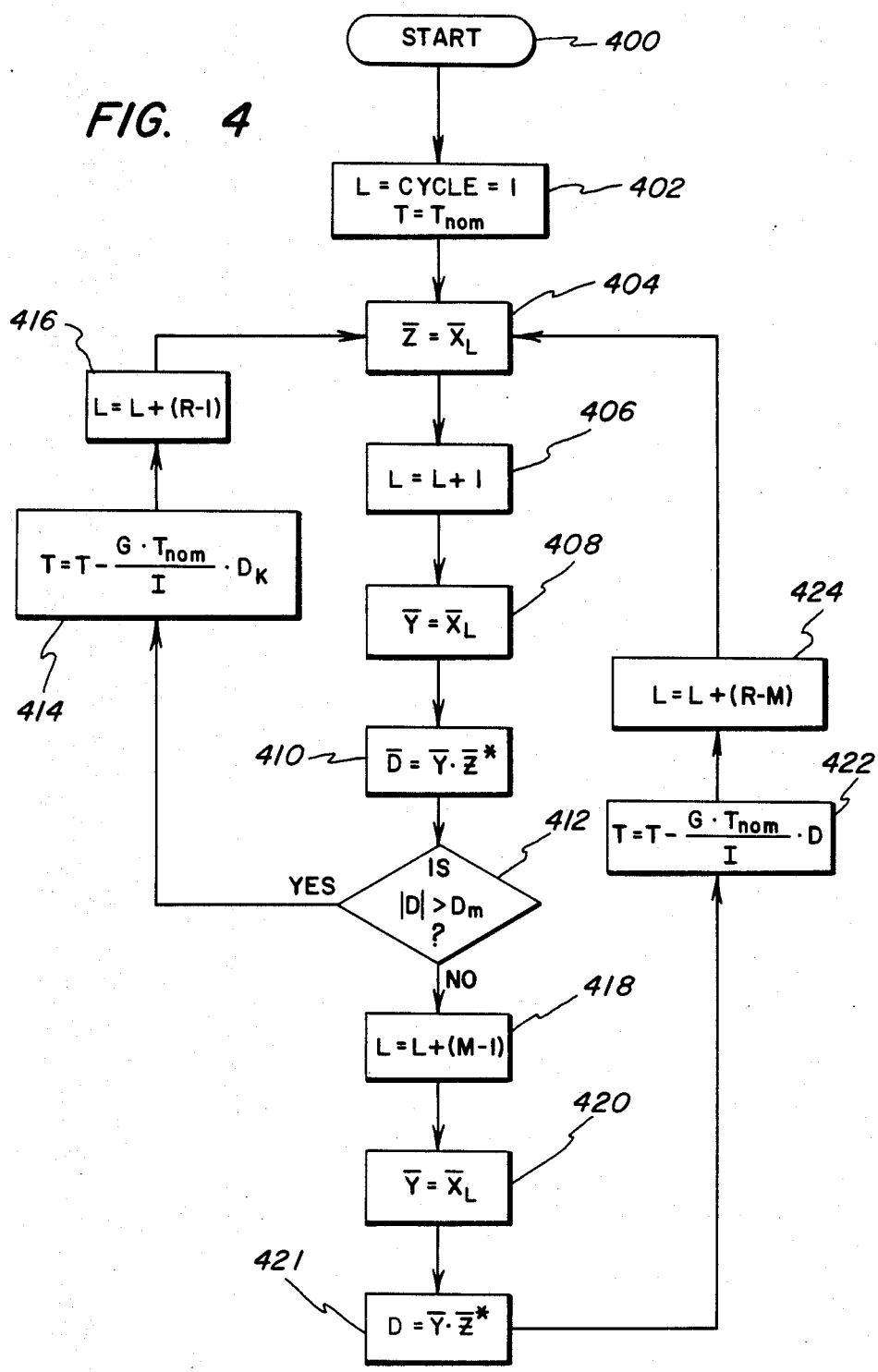
FIG. 4 is a decisional flow diagram illustrating an improved method for operating the microprocessor of FIG. 1 in accordance with the subject invention.

The present invention comprises method and apparatus for implementing an improved digital phase locked loop wherein programmable digital signal processing methods are utilized to determine the frequency of the input signal with a high degree of accuracy and without resorting to measuring the time interval between zero crossings. Similar methods for determining the frequency of a periodic signal have been disclosed and claimed in U.S. Pat. No. 4,547,726 to Premerlani and assigned to the assignee of the present invention, which is incorporated herein in its entirety. Particularly, the present invention comprises apparatus, such as that shown in FIG. 1, wherein microprocessor 100 may be programmed for implementing the methods as illustrated in FIGS. 3 and 4 such that the apparatus of FIG. 1 will perform a phase locking function.

Figure 1:
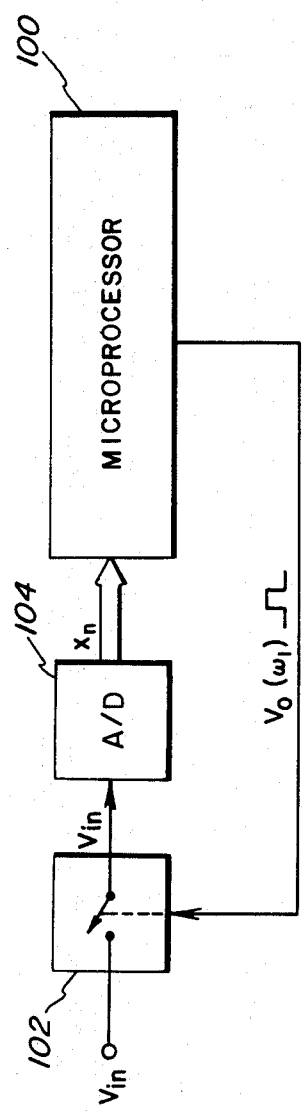
FIG. 1 is an illustrative block diagram of apparatus for implementing the method of the subject invention.

As shown in FIG. 1, the apparatus of the present invention includes sampling means 102 for receiving a sinusoidal input, generally:

$$V_{in} = A \cos(\omega t + \phi).$$

Sampling means 102 includes a control input coupled to microprocessor 100 for receiving a sampling signal $V_o$ therefrom. Sampling means 102 may comprise any device, or combination of devices, for sampling the magnitude of the analog voltage input $V_{in}$ in response to sampling signals $V_o$ received at its control input from microprocessor 100. As an example, sampling means 102 may comprise a switch, relay or other similar device for instantaneously sampling the magnitude of input voltage $V_{in}$. In one preferred embodiment, sampling means 102 comprises an AD582 sample and hold amplifier as available from the Analog Devices Company.

Sampling means 102 is coupled to an analog-to-digital (A/D) converter 104 for providing its analog voltage output $v_{in}$ thereto. A/D converter 104 converts this voltage to a digital data signal $x_n$, which data represents the magnitude of the input signal at the sampling instant. A/D converter 104 may comprise any means for converting a voltage magnitude into a digital data signal as described above. In the present embodiment, A/D converter 104 comprises an AD571 integrated circuit 10-bit analog to digital converter also available from the Analog Devices Company.

In an alternative embodiment, sampling means 102 and A/D converter 104 may comprise a single integrated circuit adapted for performing both the sampling and conversion functions. As an example, sampling means 102 and A/D converter 104 may comprise an ADC0820 flash converter with track and hold function, which converter is available from the National Semiconductor Corporation.

Microprocessor 100 is coupled to A/D converter 104 for receiving the digital data signals $x_n$ and for performing a discrete Fourier analysis thereon, as described more fully hereinbelow with reference to FIG. 3. Briefly, microprocessor 100 is adapted to receive a plurality of data signals associated with a first cycle of the input signal $V_{in}$ and to perform a discrete Fourier analysis thereon to provide a first phasor signal representing a first voltage phasor of the fundamental frequency of the discrete Fourier transform. In similar manner, a second plurality of data signals, associated with a second cycle of the input signal, are received and a second discrete Fourier analysis performed to provide a second phasor signal representing a second voltage phasor.

Voltage phasor, as used herein, is consistent with its meaning in the electrical arts, to wit, a vector representing a sinusoid in complex co-ordinates wherein the magnitude of the vector represents the amplitude of the sinusoid and the angle of the vector, with respect to the real axis, represents the phase angle of the sinusoid, with respect to a time reference. In the present invention, the sampling signal provided to sampling means 102 from microprocessor 100 comprises the time reference.

Mathematically, the first and second phasors can be used to generate a deviation phasor. The phase angle of the deviation phasor will be equal to the angular difference between the first and second voltage phasors and, therefore, will be proportional to the difference between the frequency of the sampling signal $V_o$ and the frequency of the input signal $V_{in}$. Hence, microprocessor 100 is adapted to use the first and second phasor signals to generate a difference signal which is proportional to the phase angle of the deviation phasor. The difference signal is used to modulate the frequency of the sampling signal such that the difference signal is minimized and the frequency of the sampling signal is maintained in constant proportion to the frequency of the input signal.

Microprocessor 100 may comprise any digital signal processing circuitry for performing the method as described herein. In the present embodiment, microprocessor 100 comprises an 8051 microprocessor available from the Intel Co.

Figure 2:
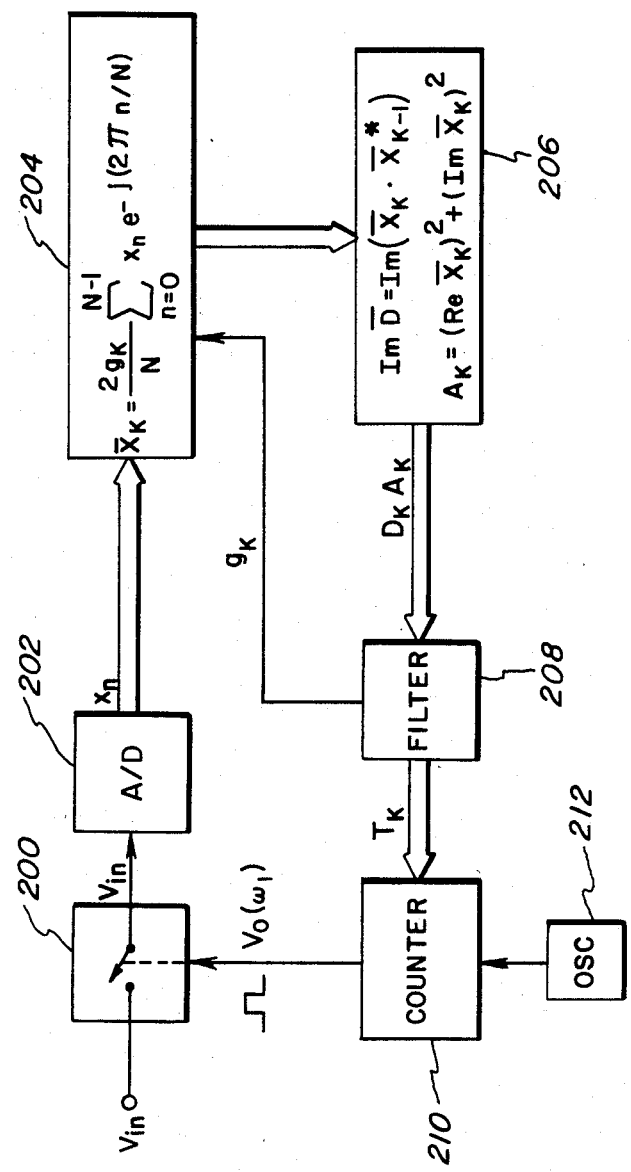
FIG. 2 is an illustrative block diagram of alternative apparatus for implementing the subject invention.

Referring to FIG. 2, there is provided an illustrative block diagram of alternative apparatus for implementing the present invention. Therein, sampling means 200 is provided for receiving the sinusoidal input $V_{in}$ and for providing therefrom an analog voltage output $v_{in}$ at a sampling rate as determined by the sampling signal $V_o$. An A/D converter 202 is coupled for receiving the analog voltage output $v_{in}$ of sampling means 200 and for converting this analog voltage signal to a digital data signal $x_n$ wherein the data represents the magnitude of the input voltage at the sampling instant. Sampling means 200 and A/D converter 202 operate in a manner similar to sampling means 102 and A/D converter 104 (FIG. 1) and, therefore, may comprise devices similar to sampling means 102 and A/D converter 104 of FIG. 1.

Fourier analysis means 204 is provided for receiving a plurality of data signals $x_n$, representing one cycle, k, of input voltage $V_{in}$ and performing a discrete Fourier analysis thereon to convert these data signals to a phasor signal representing a voltage phasor $\overline{X}_k$ associated with the $k^{th}$ cycle, wherein:

$$\overline{X}_k = (2g_k/N) \sum_{n=0}^{N-1} x_n e^{-j(2\pi n/N)},$$

wherein $g_k$ is an automatic gain control feedback signal as will be described more fully hereinbelow.

Difference means 206 are provided and coupled to Fourier analysis means 204 for receiving a plurality of phasor signals representing a plurality of voltage phasors $\overline{X}_k$ and for providing a difference signal D representing the angular difference between successive voltage phasors $\overline{X}_k$ and $\overline{X}_{k-1}$, i.e.:

$$D_k = Im \ \overline{D}_k = Im \ [\overline{X}_k \cdot (\overline{X}_{k-1})^*],$$

wherein $(\overline{X}_{k-1})^*$ represents the complex conjugate of the $(k-1)^{th}$ voltage phasor as is known in the art. That is, if:

$$\overline{X}_{k-1} = a + jb,$$

then:

$$(\overline{X}_{k-1})^* = a - jb.$$

Difference means 206 is also adapted to provide the amplitude $A_k$, associated with the $k^{th}$ cycle of the input signal, from the phasor $\overline{X}_k$ in accordance with the following formula:

$$A_k = (\text{Real } \overline{X}_k)^2 + (\text{Imag } \overline{X}_k)^2.$$

Fourier analysis means 204 and difference means 206 may comprise any device, or plurality of devices, for implementing the digital signal processing functions as described hereinabove. Particularly, Fourier analysis means 204 and/or difference means 206 may comprise a properly programmed digital signal processing device such as microprocessor 100 of FIG. 1. Alternatively, Fourier analysis means 204 and/or difference means 206 may comprise other digital signal processing means, such as a digital array, adapted for performing the functions described above. Many other possibilities for implementing the functions performed by Fourier analysis means 204 and difference means 206 will readily become apparent to those skilled in the art.

A digital filter 208 is provided for receiving the output $D_k$ of difference means 206 and for performing a low pass frequency error filtering function thereon to alleviate the effects of noise which may accompany the input signal $V_{in}$. As an example filter 208 may comprise a digital integrator adapted for implementing the following function:

$$T_k = T_{k-1} - (G \cdot T_{nom}/I) \cdot D_k,$$

wherein $T_{nom}$ is the nominal period of the sampling signal, I is a constant defined below and G is a constant gain factor which provides a tradeoff between stability and transient response, i.e., a low value for G will increase the speed of the transient response while decreasing the stability of the loop and, conversely, a high value for G will decrease the speed of the transient response while increasing the stability of the loop. In a preferred embodiment, G is chosen in accordance with the following limitations:

$$0 < G \leq 1.$$

Filter 208 is also adapted to receive the amplitude $A_k$ from difference means 206 and to perform automatic gain control filtering thereon to provide automatic gain control to the input signal as is known in the art. As an example, filter 208 may by adapted to implement the following function:

$$g_k = g_{k-1} - C(A_k - I),$$

wherein $g_k$ is the automatic gain control feedback signal, $A_k$ is the input signal amplitude received from difference means 206, I is the desired constant amplitude of the input signal and C is a constant chosen in accordance with the following limitations:

$$0 < C \leq I.$$

Filter 208 is shown coupled to Fourier analysis means 204 for providing the automatic gain control feedback signal $g_{k-1}$ thereto. However, it will be appreciated by those skilled in the art that the multiplication by $g_{k-1}$ to provide automatic gain control could be accomplished at any stage prior to filter 208.

Filter 208 may comprise any combination of digital elements adapted for performing the digital filtering function as described hereinabove. It will be apparent to those skilled in the art that although filter 208 is shown as one discrete element in FIG. 2, the filter may actually comprise two or more discrete elements, some for providing lowpass frequency error filtering to difference signal D and others for providing automatic gain control filtering to the amplitude $A_k$ received from difference means 206. Further, it will be apparent to those skilled in the art that filter 208 may be adapted to provide only lowpass frequency error filtering of the difference signal D, without automatic gain control, wherein the phasor $\overline{X}_k$ provided from Fourier analysis means 204 is provided in accordance with the following:

$$\overline{X}_k = (2/N) \sum_{n=0}^{N-1} x_n e^{-j(2\pi n/N)},$$

and wherein the period $T_k$ is provided accordingly:

$$T_k = T_{k-1} - (G \cdot T_{nom}/A_k) \cdot D_k.$$

Filter 208 is coupled to a digital counter 210 for providing the sampling period $T_k$ thereto. Counter 210 is coupled to a fixed frequency oscillator 212 for receiving a fixed frequency digital oscillating signal therefrom. Counter 210 is adapted for counting pulses received from oscillator 212 until a number of pulses representing the period $T_k$ have been received and, thereafter, providing a sampling pulse to sampling means 200. In the present embodiment, counter 210 may comprise a 74LS592 counter as available from the Texas Instruments Company. Oscillator 212 may comprise any means for providing a fixed frequency oscillating signal as is well known in the art.

Hence, digital signal processing apparatus has been described for implementing a digital phase locked loop wherein the frequency of the input signal is determined with a high degree of accuracy and without resorting to measuring time intervals occurring between its zero crossings. With reference to FIG. 3, there is shown a decisional flow diagram illustrating a method for performing these functions, which method is particularly suitable for implementation in microprocessor 100 of FIG. 1.

The method of FIG. 3 is initiated in step 300 by powering the apparatus of FIG. 1 and initializing microprocessor 100 for receipt of initial data signals $x_n$. An index variable k is selected and is initialized as one, step 302. Index variable k is provided for indexing the cycles of the input signal, and thereby sequencing the generated phasor values. Also, an initial phasor value $\overline{X}_o$ is initialized at zero and an initial value for the sampling period $T_0$ is chosen as the nominal sampling period $T_{nom}$, step 302. During the next step of the method, step 304, a second index variable n is chosen for indexing the plurality of digital data signals $x_n$ received during one cycle, k, of input signal $V_{in}$. After the first sample has been received, step 306 is performed wherein the real and imaginary values $a_k$ and $b_k$, respectively, for the first voltage phasor $\overline{X}_k$ are provided in accordance with the formulas as shown, namely:

$$a_k = a_k + x_n c_n, \text{ and}$$

$$b_k = b_k + x_n d_n.$$

The index value n is incremented by one, step 308, and is thereafter compared with a sampling value N, step 310. Sampling value N represents the number of data signals $x_n$ to be provided for each cycle of input voltage $V_{in}$. Thus, steps 306, 308 and 310 are continually performed until N data signals associated with one cycle of input voltage $V_{in}$ have been received. It will be apparent to those skilled in the art that repeating steps 306, 308 and 310 for N data signals is equivalent to performing a discrete Fourier analysis, to wit:

$$\overline{X}_k = (2/N) \sum_{n=0}^{N-1} x_n e^{-j(2\pi n/N)}$$

wherein $c_n$ is chosen to equal the real portion of $e^{-j(2\pi n/N)}$ and wherein $d_n$ is chosen to equal the imaginary portion of $e^{-j(2\pi n/N)}$, such that:

$c_n = \cos(2\pi n/N)$, $d_n = -\sin(2\pi n/N)$, and $\overline{X}_k = a_k + jb_k$.

It should be noted that if the number of samples N to be provided for each period of input voltage $V_{in}$ is determined in advance and data samples $x_n$ are to be uniformly distributed, then values $c_n$ and $d_n$ referred to above may be precomputed and stored in lookup tables, as is known in the art, to thereby reduce computational time necessary for execution of the method illustrated in FIG. 3. Further, while the method of FIG. 3 has been described as a continuous process being performed in a piecemeal fashion as the data signals $x_n$ are received, it will be apparent to those skilled in the art that N data signals associated with a complete cycle of the input signal can be stored in memory as received such that the computation described above can be performed in its entirety after all N values have been obtained.

Returning to FIG. 3, after N data signals have been provided and a phasor signal representing the voltage phasor $\overline{X}_k$ has been generated, microprocessor 100 proceeds to step 312 wherein a difference signal D is generated. The operation performed in step 312 of FIG. 3 is similar to that performed by difference means 206 of FIG. 2, to wit:

$D = Im \overline{D}$ (1)

$= Im[(\overline{X}_k) \cdot (\overline{X}_{k-1})^*]$ (2)

$= |X_k| \cdot |X_{k-1}| \sin(\theta_k - \theta_{k-1})$ (3)

$= b_k a_{k-1} - a_k b_{k-1}$. (4)

It should be noted that the difference signal generated by step 312 (FIG. 3) is proportional to the angular difference between successive phasors $\overline{X}_k$. It will be apparent to those skilled in the art that by properly controlling sampling means 102 to minimize the angular displacement $(\theta_k - \theta_{k-1})$ between successive voltage phasors $\overline{X}_k$ and $\overline{X}_{k-1}$, the value of D, proportional to the $\sin(\theta_k - \theta_{k-1})$, will be minimized and the sampling frequency will be maintained in substantially constant proportion to the input frequency. Indeed, where the sampling frequency is in proper proportion to the input frequency, the $\sin(\theta_k - \theta_{k-1})$ will equal zero and, hence, D will equal zero. Therefore, the difference signal D may be used to modulate the sampling signal provided to sampling means 102 from microprocessor 100 (FIG. 1).

Returning to FIG. 3, after difference value D is generated, the sampling period $T_k$ is increased or decreased by difference signal D, step 314, and thereafter, index variable k is incremented, step 316. The method is continually repeated from step 304 to generate the next succeeding voltage phasor $\overline{X}_k$ such that another difference signal D can be generated and the sampling period readjusted.

With reference to FIG. 4, there is shown an improved method for operating microprocessor 100 of FIG. 1 such that the microprocessor may make a more sensitive frequency deviation measurement and, therefore, provide more sensitive frequency locking. The method of FIG. 4 is initiated in step 400 wherein microprocessor 100 is initialized for receipt of the first signal values $x_n$. An index value L is chosen to index each cycle of the input signal and is initialized at one, step 402. Additionally, step 402 provides an initial value for the sampling period T as the nominal period of the sampling signal. After N data signals $x_n$ have been received, a first phasor signal representing a first voltage phasor $\overline{Z}$ is provided as described in steps 304–310 of FIG. 3, step 404. Thereafter, the index variable L is incremented by one, step 406, and a second phasor signal representing a second voltage phasor $\overline{Y}$ is generated from data signals associated with the second cycle of the input signal, step 408. A deviation signal representing a deviation phasor is generated from the voltage phasors associated with the first and second cycles, step 410, and is used to generate the difference signal, as described above.

To determine whether a more sensitive frequency deviation measurement will be valid, the angle of the deviation phasor is compared with a predetermined maximum angle $\theta_m$ to determine whether the difference in frequency between the input signal and the sampling signal is within an allowable range. The allowable range for the deviation phasor angle is chosen to prevent the loop from aliasing, i.e., locking to harmonics of the input signal. In the present embodiment, the angle of the deviation phasor is limited in accordance with the following expression:

$\theta_m = (\pi/2M)$.

To determine whether the angle of the deviation phasor is within the allowable range, the deviation phasor $\overline{D}$ is used to generate a maximum allowable difference signal $D_m$ as follows:

$D_m = |\text{Real } \overline{D}| \cdot \tan \theta_m$.

The absolute value of the difference signal D is compared to the maximum allowable difference signal $D_m$, step 412. If the absolute value of the generated difference value D is greater than the maximum allowable difference value $D_m$, then the angle of the deviation phasor $\overline{D}$ is greater than the maximum allowable angle $\theta_m$ and, therefore, the deviation in frequency is outside of the allowable range indicating that a more sensitive measurement will not be valid. Hence, a new value for the period is generated from the existing difference signal, step 414, and the index value L is incremented by (R−1), step 416, such that the method of steps 404–412 will be repeated every R cycles. The method of FIG. 4 will continue to operate in this manner, generating difference signals using samples taken from consecutive cycles of the input signal until the deviation phasor angle is within the allowable range, this indicating the validity of a more sensitive measurement.

It should be noted that operation in the manner described above, i.e. providing a difference signal for voltage phasors associated with consecutive cycles of the input signal, limits the angular displacement between the first and second voltage phasors for small frequency deviations. This in turn increases the locking range of the subject apparatus at the expense of sensitivity to small frequency deviations. Therefore, after the angle of the deviation phasor is determined to be within the allowable range, step 412, the index variable L is incremented by a value corresponding to M−1 cycles, step 418, and the second voltage phasor $\overline{Y}$ is generated, step 420, such that a difference signal can be provided which represents the angular displacement between the phasor $\overline{Z}$ associated with data signals taken M cycles before the data signals associated with the phasor $\overline{Y}$, step 421. Operation in this mode, i.e., generating a difference value for phasors representing nonconsecutive cycles of the input signal, increases the angular displacement between the first and second voltage phasors over that of the previous measurement for the same frequency deviation. Accordingly, the sensitivity of the subject apparatus to small frequency deviations is increased while the likelihood that the apparatus will lock to a harmonic of the input signal is increased.

After developing the difference signal of step 421, microprocessor 100 modulates the sampling period $T_k$, step 422, and updates index variable L, step 424, such that the calculation will be repeated every R cycles.

It will be apparent to those skilled in the art that the method shown in FIG. 4 provides a sampling signal which is very sensitive to small deviations in the input frequency while not being unduly susceptible to aliasing. That is, although some tracking range is lost in an attempt to increase sensitivity by allowing M cycles to pass between generation of phasor values $\overline{Z}$ and $\overline{Y}$, this effect is alleviated by the determination of step 412 wherein microprocessor 100 essentially determines that the sampling frequency has not deviated an unacceptable amount from the input frequency over one cycle and, hence, verifies the accuracy of the calculation to be performed M cycles later in step 421. Further, while the method of FIG. 4 has been described by reference to a coarse measurement using consecutive voltage phasors and a fine measurement wherein the voltage phasors are separated by M cycles, it will be apparent to those skilled in the art that the coarse measurement could be performed with phasors separated by Q cycles to verify the accuracy of the more fine measurement where the phasors are separated by M cycles, so long as Q<M.

It will be appreciated by those skilled in the art that the subject method and apparatus may readily be applied to phase locking of three phase systems. In such an embodiment samples would be taken from each of the three phases and used to generate phasors for each cycle of each phase. Three deviation phasors, $\overline{D}_a$, $\overline{D}_b$ and $\overline{D}_c$ would be generated wherein the angle of each deviation phasor is indicative of the difference between the sampling frequency and the frequency of the respective phase. A composite deviation phasor $\overline{D}_{com}$ would be generated in accordance with the following formula:

$$\overline{D}_{com} = \overline{D}_a + \overline{D}_b + \overline{D}_c.$$

The composite deviation phasor would then be used to generate a difference signal, which difference signal could be used to modulate the sampling signal.

While only several presently preferred embodiments of my novel method and apparatus have been presented in detail herein, many modifications and variations will now become apparent to those skilled in the art. It is my intent, therefore, to be limited only by the scope of the appended claims and not by the specific details presented herein.

What is claimed is:

1. A method for providing a sampling signal having a first frequency corresponding to a first period wherein said first frequency is maintained in substantially constant proportion to a second frequency of an input signal, said method comprising the steps of:
   (a) sampling said input signal at instants determined by said sampling signal to provide first and second pluralities of data signals associated with respective first and second cycles of said input signal, wherein each said data signal represents the magnitude of said input signal at the sampling instant;
   (b) performing a discrete Fourier analysis on each of said first and second plurality of data signals to provide first and second phasor signals, wherein each said first and second phasor signal is indicative of respective first and second voltage phasors associated with the fundamental frequency of the discrete Fourier transform of said first and second cycles, respectively;
   (c) generating a difference signal representing the angular displacement between said first and second voltage phasors and, therefore, representing the difference between said first and second frequencies; and
   (d) modulating said first period in response to said difference signal such that said difference signal is minimized and, therefore, said first frequency is maintained in substantially constant proportion to said second frequency.

2. The method as recited in claim 1 wherein N of said data signals respectively designated $x_n$ for n=0 through N−1 are provided for each said first and second cycle, and wherein the value of each said first and second phasor signal is provided in accordance with the following expression:

$$X = (2/N) \sum_{n=0}^{N-1} x_n e^{-j(2\pi n/N)},$$

wherein X represents the value of the subject phasor signal.

3. The method as recited in claim 2 wherein said first cycle precedes said second cycle and wherein the value of said difference signal is provided in accordance with the following expression:

$$D = Im(\overline{X}_k \cdot \overline{X}_{k-1}^*),$$

wherein $(\overline{X}_{k-1})^*$ represents the value of the complex conjugate of said first voltage phasor, $\overline{X}_k$ represents the value of said second voltage phasor and D represents the value of said difference signal.

4. The method as recited in claim 3 wherein said first period is modulated in accordance with the following expression:

$$T_k = T_{k-1} - (G \cdot T_{nom}/A_k) \cdot D,$$

wherein $T_k$ and $T_{k-1}$ represent the new and old values for said first period, $T_{nom}$ represents the value of the nominal sampling period, $A_k$ represents the amplitude of said input signal the value of which is provided in accordance with the following expression:

$$A_k = (\text{Real } \overline{X}_k)^2 + (\text{Imag } \overline{X}_k)^2,$$

and G represents a constant chosen in accordance with the following limitations:

$$0 < G \leq 1.$$

5. A method for providing a sampling signal having a first frequency corresponding to a first period wherein said first frequency is maintained in substantially constant proportion to a second frequency of an input signal, said method comprising the steps of:

(a) sampling a first cycle of said input signal at instants determined by said sampling signal and performing a discrete Fourier analysis to provide a first phasor signal indicative of a first voltage phasor associated with the fundamental frequency of the discrete Fourier transform of said first cycle;

(b) sampling a second cycle of said input signal at instants determined by said sampling signal and performing a discrete Fourier analysis to provide a second phasor signal indicative of a second voltage phasor associated with the fundamental frequency of the discrete Fourier transform of said second cycle, wherein said first cycle precedes said second cycle by Q cycles;

(c) determining whether the angle between said first and second voltage phasors is greater than a predetermined maximum angle and, if so, performing steps (d) and (e), and conversely, if the angle between said first and second voltage phasors is not greater that said predetermined angle, then performing steps (f)-(h);

(d) generating a first difference signal representing the angular displacement between said first and second voltage phasors and, therefore, representing the difference between said first and second frequencies;

(e) modulating said first period in response to said first difference signal such that said first difference signal is reduced and, therefore, the difference between said first and second frequencies is reduced, and repeating steps (a)-(c);

(f) sampling a third cycle of said input signal at instants determined by said sampling signal and performing a discrete Fourier analysis to provide a third phasor signal indicative of a third voltage phasor associated with the fundamental frequency of the discrete Fourier transform of said third cycle, wherein said first cycle precedes said third cycle by M cycles, and wherein M is greater than Q;

(g) generating a second difference signal representing the angular displacement between said first and third voltage phasors and, therefore, representing the difference between said first and second frequencies; and (h) modulating said first period in response to said second difference signal such that said second difference signal is minimized and, therefore, said first frequency is maintained in substantially constant proportion to said second frequency, and repeating steps (a)-(c).

6. The method as recited in claim 5 wherein N data samples respectively designated $x_n$ for n=0 through N−1 are provided for each said first, second and third cycles, and wherein the value of each said first, second and third phasor signal is provided in accordance with the following expression:

$$\overline{X} = (2/N) \sum_{n=0}^{N-1} x_n e^{-j(2\pi n/N)},$$

wherein $\overline{X}$ represents the value of the subject phasor signal.

7. The method as recited in claim 6 wherein the value of said first and second difference signals are provided in accordance with the following expressions:

$$D_1 = Im\ (\overline{X}_{k+Q} \cdot \overline{X}_k^*),$$

$$D_2 = Im\ (\overline{X}_{k+M} \cdot \overline{X}_k^*),$$

where $D_1$ and $D_2$ represent the values of said first and second difference signals, respectively, $\overline{X}_{k+Q}$ and $\overline{X}_{k+M}$ represent the value of said second and third voltage phasors, respectively, and $\overline{X}_k^*$ represents the value of the complex conjugate of said first voltage phasor.

8. The method as recited in claim 7 wherein said first period is modulated in accordance with the following expressions:

$$T_k = T_{k-1} - (G \cdot T_{nom}/A_k) \cdot D_1,\ \text{and}$$

$$T_k = T_{k-1} - (G \cdot T_{nom}/A_k) \cdot D_2,$$

wherein $T_k$ and $T_{k-1}$ represent the new and old values for said first period, $T_{nom}$ represents the value of the nominal sampling period $A_k$ represents the amplitude of said input signal, the value of which is provided in accordance with the following expression:

$$A_k = (\text{Real } \overline{X}_k)^2 + (\text{Imag } \overline{X}_k)^2,$$

and G represents a constant chosen in accordance with the following limitations:

$$0 < G \leq 1.$$

9. Apparatus for providing a sampling signal having a first frequency corresponding to a first period wherein said first frequency is maintained in substantially constant proportion to a second frequency of an input signal, said apparatus comprising:

(a) means for sampling said input signal at instants determined by said sampling signal to provide first and second pluralities of data signals associated with respective first and second cycles of said input signal, wherein each said data signal represents the magnitude of said input signal at the sampling instant;

(b) signal processing means for performing a discrete Fourier analysis on each of said first and second plurality of data signals to provide first and second phasor signals, wherein each said first and second phasor signal is indicative of respective first and second voltage phasors associated with the fundamental frequency of the discrete Fourier transform of said first and second cycles, respectively, said signal processing means being adapted to generate a difference signal representing the angular displacement between said first and second voltage phasors and, therefore, representing the difference between said first and second frequencies, said signal processing means being further adapted to provide said sampling signal and to modulate said first period in response to said difference signal such that said difference signal is minimized and, therefore, said first frequency is maintained in substantially constant proportion to said second frequency.

10. Apparatus as recited in claim 9 wherein said sampling signal is adapted to provide N of said data signals respectively designated $x_n$ for $n=0$ through $N-1$ for each said first and second cycle, and wherein said signal processing means is adapted to determine the value of each said first and second phasor signal in accordance with the following expression:

$$\overline{X} = (2/N) \sum_{n=0}^{N-1} x_n e^{-j(2\pi n/N)},$$

wherein $\overline{X}$ represents the value of the subject phasor signal.

11. Apparatus as recited in claim 10 wherein said first cycle precedes said second cycle and wherein said signal processing means is adapted to determine the value of said difference signal in accordance with the following expression:

$$D = Im\ (\overline{X}_k \overline{X}_{k-1}^*),$$

wherein $(X_{k-1})^*$ represents the value of the complex conjugate of said first voltage phasor, $\overline{X}_k$ represents the value of said second voltage phasor and D represents the value of said difference signal.

12. Apparatus as recited in claim 11 wherein said signal processing means is adapted to modulate said first period in accordance with the following expression:

$$T_k = T_{k-1} - (G \cdot T_{nom}/A_k) \cdot D,$$

wherein $T_k$ and $T_{k-1}$ represent the new and old values for said first period, $T_{nom}$ represents the value of the nominal sampling period, $A_k$ represents the amplitude of said input signal the value of which is provided in accordance with the following expression:

$$A_k = (\text{Real}\ \overline{X}_k)^2 + (\text{Imag}\ \overline{X}_k)^2,$$

and G represents a constant chosen in accordance with the following limitations:

$$0 < G \leq 1.$$

13. Apparatus as recited in claim 11 wherein said signal processing means is adapted to provide automatic gain control to said input signal, multiplying said input signal by an automatic gain control feedback signal $g_{k-1}$, to maintain the amplitude of said input signal to equal a constant value I, wherein the value of said AGC feedback signal $g_{k-1}$ is provided in accordance with the following expression:

$$g_k = g_{k-1} - C(A_k - I),$$

wherein $A_k$ represents the amplitude of said input signal the value of which is provided in accordance with the following expression:

$$A_k = (\text{Real}\ \overline{X}_k)^2 + (\text{Imag}\ \overline{X}_k)^2,$$

and wherein C represents a constant chosen in accordance with the following limitations:

$$0 < C \leq I;$$

said signal processing means being further adapted to modulate said first period in accordance with the following expression:

$$T_k = T_{k-1} - (G \cdot T_{nom}/I) \cdot D,$$

wherein $T_k$ and $T_{k-1}$ represents the new and old values for said first period, $T_{nom}$ represents the value of the nominal sampling period and G represents a constant chosen in accordance with the following limitations:

$$0 < G \leq 1.$$

* * * * *